United States Patent [19]

Colella et al.

[11] Patent Number: 5,576,561

[45] Date of Patent: Nov. 19, 1996

[54] RADIATION-TOLERANT IMAGING DEVICE

[75] Inventors: Nicholas J. Colella, Livermore; Joseph R. Kimbrough, Pleasanton, both of Calif.

[73] Assignee: United States Department of Energy, Washington, D.C.

[21] Appl. No.: 291,085

[22] Filed: Aug. 18, 1994

[51] Int. Cl.$^6$ .................. H01L 27/148; H01L 29/768
[52] U.S. Cl. .................. 257/217; 257/220; 257/224; 257/239; 257/249
[58] Field of Search .................. 257/216, 217, 257/218, 219, 220, 239, 249, 250, 222, 224, 225

[56] References Cited

U.S. PATENT DOCUMENTS

| | | | |
|---|---|---|---|
| 3,787,823 | 1/1974 | Negishi | 257/217 |
| 4,517,733 | 5/1985 | Hamano | 257/222 |
| 4,751,193 | 6/1988 | Myrick | 437/19 |
| 5,017,989 | 5/1991 | Street et al. | 257/222 |
| 5,438,211 | 8/1995 | Nakamura et al. | 257/249 |

FOREIGN PATENT DOCUMENTS

| | | | |
|---|---|---|---|
| 63-188971 | 8/1988 | Japan | 257/218 |
| 2-246369 | 10/1990 | Japan | 257/249 |

*Primary Examiner*—Ngân V. Ngô
*Attorney, Agent, or Firm*—Gary R. Drew; William C. Daubenspeck; William R. Moser

[57] ABSTRACT

A barrier at a uniform depth for an entire wafer is used to produce imaging devices less susceptible to noise pulses produced by the passage of ionizing radiation. The barrier prevents charge created in the bulk silicon of a CCD detector or a semiconductor logic or memory device from entering the collection volume of each pixel in the imaging device. The charge barrier is a physical barrier, a potential barrier, or a combination of both. The physical barrier is formed by an $SiO_2$ insulator. The potential barrier is formed by increasing the concentration of majority carriers (holes) to combine with the electron's generated by the ionizing radiation. A manufacturer of CCD imaging devices can produce radiation-tolerant devices by merely changing the wafer type fed into his process stream from a standard wafer to one possessing a barrier beneath its surface, thus introducing a very small added cost to his production cost. An effective barrier type is an $SiO_2$ layer.

14 Claims, 2 Drawing Sheets

RADIATION-TOLERANT IMAGING DEVICE

GOVERNMENT RIGHTS

The United States Government has rights in this invention pursuant to Contract No. W-7405-ENG-48 between the United States Department of Energy and the University of California.

BACKGROUND OF THE INVENTION

1. Field of the Invention

This invention relates to charge-coupled devices (CCD) and, more particularly, to techniques for improving the performance of such devices in the presence of ionizing radiation, e.g., x-rays, gamma rays, and energetic charged particles.

2. Prior Art

The concept of a Schottky-barrier infra-red (IR) photon detector, which utilizes internal photo emission of "hot" carriers (holes), was first proposed by Shepherd and Yang in 1973. The Schottky barrier approach to monolithic IR CCDs is based on internal photo emission from metal-semiconductor Schottky barrier arrays on a silicon substrate. Hot carriers (holes) are generated in the metal by absorption of photons with wavelengths greater than cutoff that penetrate through the semiconductor. Those hot carriers, or holes, with proper energy and momentum transit the contact barrier potential and are emitted into the semiconductor, where they neutralize fixed charges at the edge of the depletion region induced by application of a reverse-bias voltage. Signal readout may be accomplished by a MOS transfer gate conversion of majority carriers to minority carriers required by the Si CCD. As a result of the photo-detection in the metal film, the Schottky barrier devices have highly uniform responsivity across an array but, while they have relatively low photo emissive yield in comparison to other CCDs, experience has shown that adequate IR imagery can be achieved.

A Schottky barrier detector is a photon detector, which utilizes the internal photo emission of "hot" carriers (holes) from metal or metal silicide electrodes into silicon for the detection of radiation. For the hole emission process, a back-illuminated Schottky barrier detector operates in the spectral window between the band gap of silicon (Eg) and the so-called Schottky barrier height ($\psi$). Photons with energies between the band gap and the barrier height—that is, $Eg < hv < \psi$—will be transmitted through the silicon substrate and absorbed in the metal electrode of the junction.

A problem arises when ionizing radiation passes through the silicon substrate because a penetrating energetic charged particle generates electron-hole pairs along its path by ionization of atoms in the substrate. The problem is that the ionizing radiation passing through the silicon substrate generates electrical charge carriers that are also collected by the active charge collection area. The charge generated by the ionizing radiation is large enough to mask the image signal and can saturate the active area of a pixel. Ionizing radiation can render CCD cameras useless as imaging devices and is a significant problem for CCD cameras in space and nuclear weapon radiation environments.

A need exists for a technique for reducing the effect of the electrical charge that is generated by ionizing radiation in the silicon substrate of a CCD detector.

SUMMARY OF THE INVENTION

It is therefore an object of the invention to provide a wafer-scale charge isolation method which inhibits or reduces the flow of electrons, which are created in the bulk regions of a silicon wafer due to the passage of an ionizing radiation, and prevents the electrons from reaching the active charge collection volume of a pixel in a charge coupled device (CCD) operating in either the visible or the infrared (IR) wavelength band.

In accordance with these and other objects of the invention, apparatus and a method are provided for improving the performance of charge-coupled devices (CCD) in the presence of ionizing radiation. The invention is a wafer-scale charge isolation technique which inhibits or reduces the flow of electrons created by the passage of ionizing radiation in the bulk regions of a silicon charge coupled device (CCD). The technique has been tested in a device designed for operating in the infrared (IR) wavelength band. The technique according to the invention prevents charge from reaching the active charge collection volume of a pixel in a CCD.

The invention provides a charge barrier that inhibits, attenuates, or prevents charge created in the bulk silicon from entering the collection volume of each pixel in the imaging device, using either a physical layer, such as an insulator layer, a potential barrier, or a combination of an insulator layer and a potential barrier. The physical barrier is formed by creating an $SiO_2$ insulator. The potential barrier is formed by increasing the concentration of majority carriers (holes) to combine with the electron's generated by the ionizing radiation.

Since the only process changes required are at the wafer level, a manufacturer's normal semiconductor processing and testing can be applied and incremental or added costs are at a minimum. This provides a low cost radiation noise tolerant CCD, operating in either the visible or IR wavelength bands, without requiring special designs and processing of radiation hardened CCDs.

The invention includes a wafer-scale charge isolation method that inhibits or reduces the flow of electrons, which are created in the bulk regions of a silicon wafer due to the passage of an ionizing radiation, and prevents the electrons from reaching the active charge collection volume of a pixel in a charge coupled device (CCD) operating in either the visible or the infrared (IR) wavelength band. The method comprises the step of isolating charge in the bulk regions with a barrier formed in the wafer. The step of isolating charge in the bulk regions with a charge barrier formed in the wafer includes isolating with a physical barrier. The step of isolating charge in the bulk regions with a physical charge barrier formed in the wafer includes isolating with an insulator layer. The step of isolating charge in the bulk regions includes using an insulator layer formed as a buried $SiO_2$ layer. The step of isolating charge in the bulk regions with a charge barrier formed in the wafer includes isolating with a potential barrier. The step of isolating charge in the bulk regions with a potential barrier includes varying the local concentration of majority carriers (holes) at a uniform depth below the wafer surface to combine with electrons generated by the ionizing radiation. The step of isolating charge in the bulk regions with a charge barrier formed in the wafer includes isolating with an insulator and a potential barrier. The step of isolating charge in the bulk regions with an insulator includes isolating with a buried $SiO_2$ layer. The step of isolating charge in the bulk regions with a potential barrier includes the step of varying the local concentration of majority carriers at a uniform depth below the wafer surface. The silicon wafer includes platinum-silicide (PtSi) IR CCD structure.

The invention provides a CCD imaging device which includes a silicon wafer having a bulk volume and a collection volume. Means are provided for preventing charge created in the bulk volume of the silicon wafer from entering the collection volume of each pixel. A metal or metal silicide layer is formed on the silicon wafer and a CCD readout layer is formed on the metal or metal silicide layer. The means for preventing charge created in the bulk volume of the silicon wafer from entering the collection volume of each pixel in the imaging includes a barrier layer formed in the silicon wafer.

The barrier layer formed in the silicon wafer includes a physical barrier, such as insulating layer formed of $SiO_2$. The barrier layer formed in the silicon wafer can be a charge barrier, which includes a doped layer doped with boron or other suitable dopant(s) to impede the migration of electrons across the barrier region. The CCD imaging device can include both a physical barrier and a charge barrier.

This invention relates to charge sensitive semiconductors such as digital logic circuits, imaging devices, and more particularly, to techniques for improving the performance of such devices in the presence of ionizing radiation. In digital logic circuits the amount of stored charge defines a logical one or zero. As the operating voltages and circuit sizes decrease to sub micron feature size, the difference in the stored charge between a logical one or zero decreases. Thus the part becomes more sensitive to ionizing radiation in the nuclear and natural environments. Imaging devices like charge-coupled devices (CCDs) base the image on the amount of stored charge in each pixel. CCDs are an ideal way to investigate and develop methods for reducing performance degradation, due to ionizing radiation. CCDs are very sensitive to incoming radiation and the charge in each pixel can be readout as a continuous value rather than a simple binary one or zero as in logic devices.

A charge-sensitive semiconductor device having measured radiation tolerance includes a silicon substrate formed from a silicon wafer. The silicon wafer has a bulk region, or volume, and an active circuit volume, or region. Means are provided for isolating one portion of the wafer from another including means for isolating the bulk volume of the silicon wafer from the actual circuit volume to prevent and inhibit charged particles created in the bulk volume due to ionizing radiation from reaching the active circuit volume. The means for isolating includes a charge barrier or a physical barrier.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
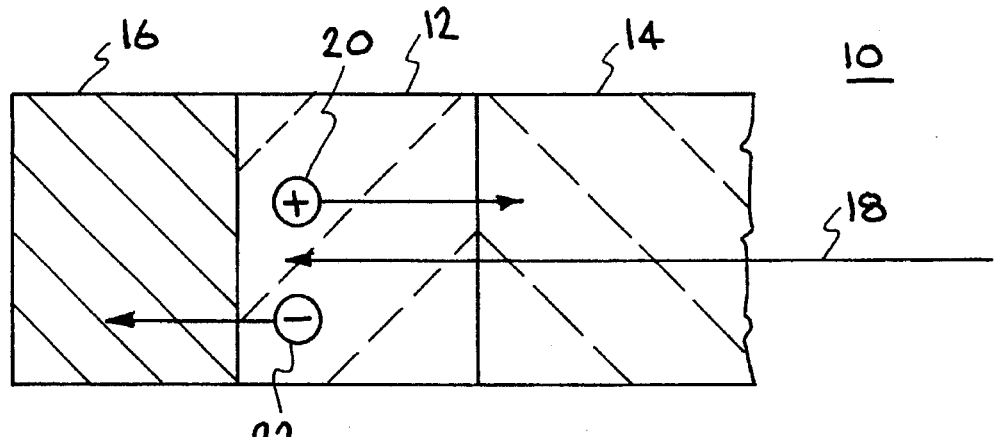
FIG. 1 is a cross section of a typical back-side illuminated platinum silicide (PtSi) Schottky-barrier infrared CCD sensor.

FIG. 1 illustrates a typical back-side illuminated platinum silicide (PtSi) Schottky-barrier infrared (IR) focal-plane-array sensor, or detector, 10. A basic Schottky-barrier infrared (IR) CCD detector is made by depositing a thin film, or layer, 12 of platinum silicide (PtSi) on a p-substrate silicon wafer 14 and providing a CCD readout connection 16. The platinum silicide (PtSi) layer 12 and the p-substrate silicon wafer create a potential barrier that prevents carrier holes in the thin film 12 of platinum silicide from moving into the silicon substrate 14.

In operation, an incident IR photon 18 passes through the silicon substrate 14 and is absorbed in the platinum silicide layer 12, generating a hole 20 and an electron 22. The hole 20 has enough energy to cross over into the silicon substrate 14. In the case of charge coupled devices (CCD), the negative charge 22 collected in the active area of each pixel is transferred out of the device by the CCD read out connection 16. Electrons are transferred to readout electronics for formation of an IR image, as known in the art.

Figure 2:
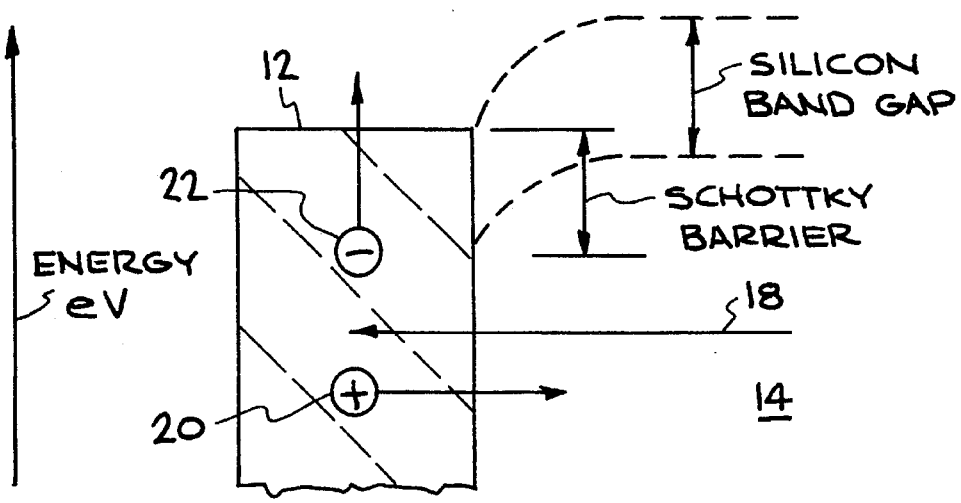
FIG. 2 shows the energy levels for a typical back-side illuminated platinum silicide (PtSi) Schottky-Barrier infrared sensor.

FIG. 2 is a diagram of the energy levels for a typical back-side illuminated platinum silicide (PtSi) Schottky-barrier Infrared CCD device. The Schottky barrier detector is a photon detector, which utilizes the internal photo emission of "hot" carriers (holes) from metal or metal silicide electrodes into silicon for the detection of a photon 18. For creation of the electron 22 and emission of the hole 20, the back-illuminated Schottky barrier detector operates in the spectral window between the band gap of silicon (Eg) and the so-called Schottky barrier height ($\psi$). Photons with energies between the band gap and the barrier height—that is, Eg<hv<$\psi$—are transmitted through the silicon substrate and absorbed in the metal electrode of the junction. Corresponding electrons are collected and transferred out of the device.

Figure 3:
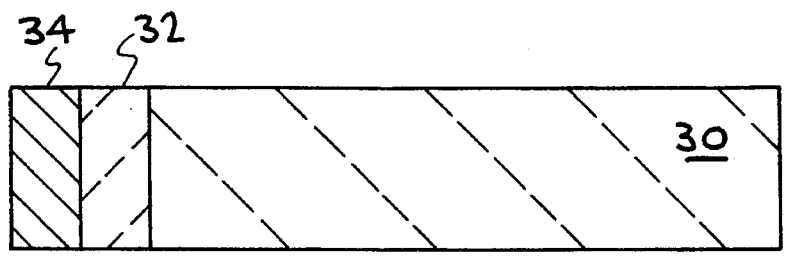
FIG. 3 is a cross-sectional drawing of a portion of a silicon wafer used for a standard IR detector.

FIG. 3 is a cross-sectional drawing of a portion of a standard p-type silicon wafer 30, which is doped with boron to a resistivity of 25–35 ohm-cm. A basic Schottky-barrier infra-red (IR) CCD detector is made by depositing a thin film, or layer, 32 of platinum silicide (PtSi) on the p-type silicon wafer 30. A CCD readout connection 34 is provided to collect electrons generated when photons strike the PtSi layer 32. In operation, an incident IR photon 18 passes through the silicon substrate 30 and is absorbed in the platinum silicide layer 32, generating a hole and an electron. The hole has enough energy to cross over into the silicon substrate 30 and the negative charge 22 is collected in the active area of each pixel and transferred out of the device by the CCD readout 34 to readout electronics for formation of an IR image. A p-type (high resistivity ohm-cm) boron doped substrate provides the optimum resistivity for the operation of this type of IR CCD.

Figure 4:
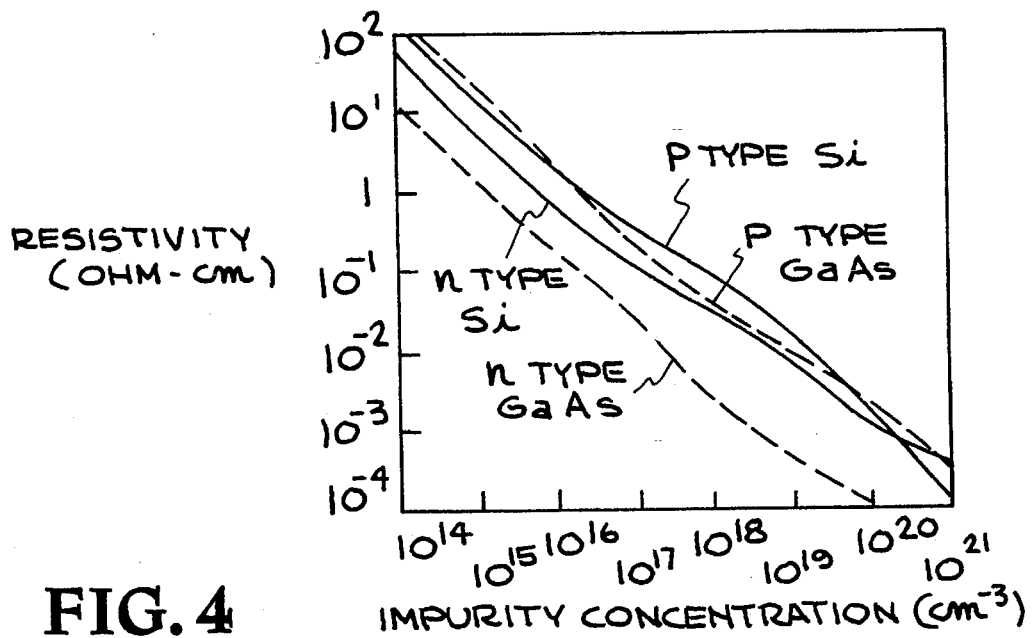
FIG. 4 shows plots of resistivity as a function of dopant concentration at 300° K. for n-type, p-type silicon, and gallium arsenide.

FIG. 4 shows plots of resistivity as a function of dopant concentration at 300° K. for n-type and p-type silicon and gallium arsenide.

Figure 5:
FIG. 5 is a cross-sectional diagram of an isolation architecture for an IR detector which uses an insulator layer as a charge barrier layer.

FIG. 5 is a diagram illustrating a cross-sectional view of a wafer 40 which uses one embodiment of a wafer-scale isolation architecture for preventing electrons created by incident radiation from interfering with the operation of a CCD detector of IR. The wafer 40 has a bulk region 42, a physical isolation charge-barrier layer 44, and an active region 46. A PtSi layer 48 and a CCD readout 50 complete the CCD device. The physical isolation charge-barrier layer 44 is a $SiO_2$ layer formed between the bulk region 42 and the active region 46 of the wafer 40. Electrons are created in the bulk region 42 of the silicon wafer 40 due to the passage of ionizing radiation. The physical charge barrier 44 prevents the electrons in the bulk region 42 from reaching the active region 46.

The bulk region 42 of the silicon wafer 40 has a resistivity of 10–20 ohm-cm. and a thickness of 525 microns. The physical barrier layer 44 is a buried $SiO_2$ insulator layer. A wafer with a $SiO_2$ layer was used to demonstrate the insulator barrier concept. In this architecture the $SiO_2$ layer is 1 micron thick and stops the electron charges from the bulk substrate. Only the electron charges created by the ionizing radiation in the 3.5 micron layer effects the IR image.

Figure 6:
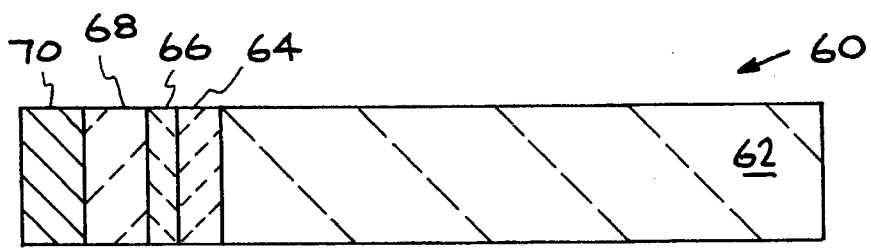
FIG. 6 is a cross-sectional diagram of an isolation architecture which uses a p+ charge barrier layer.

FIG. 6 illustrates another embodiment of a wafer-scale isolation architecture which uses a potential charge barrier for preventing electrons created by incident ionizing radiation from contributing substantial signal noise in a CCD detector of IR. The wafer 60 has a bulk region 62, a p+ potential charge-barrier layer 64, and an active region 66. A PtSi layer 68 and a CCD readout 70 complete the CCD device. The p+ potential isolation charge-barrier layer 64 has a resistivity of 0.01–0.03 ohm-cm. and is formed as a 7 micron thick layer between the bulk region 62 and the active region 66 of the wafer 60. The bulk region 62 has a resistivity of 10–30 ohm-cm and a thickness of 525 microns. The active region 66 has a resistivity of 25–35 ohm-cm and is 5.4 micron thick.

Electrons created in the bulk region 62 are prevented by the potential charge barrier layer 64 from reaching the active region 66. Electrons generated by the ionizing radiation in the 7 micron layer potential isolation layer 64 and in the substrate are absorbed by electron-hole recombination. Only the charge created in the 5.4 micron p-layer is collected and thus effects the IR image. However, sufficient ionizing radiation will generate enough electrons to fill the holes in the p+ layer 66, reducing the barrier effect of this layer.

The potential barrier concept was demonstrated by varying the local concentration of majority carriers at a uniform depth below the wafer surface. Since the charge barrier is beneath the active region of the device, a manufacturer's normal semiconductor processing is applicable and added costs are minimal.

Figure 7:
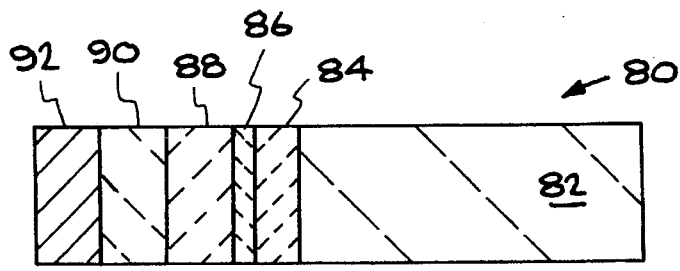
FIG. 7 is a cross-sectional diagram of an isolation architecture which uses both a p+ charge barrier layer and an insulator layer.

FIG. 7 is a diagram illustrating a portion of a wafer 80 which uses another embodiment of a wafer-scale isolation architecture for preventing electrons created by incident radiation from interfering with the operation of a CCD IR detector. This architecture uses both a p+ charge barrier layer and a physical insulator layer. The wafer 80 has a bulk region 82, a physical isolation charge-barrier layer 84, a n layer 86, and an active region 88. A PtSi layer 90 and a CCD readout 92 complete the CCD device.

The bulk region 82 has a resistivity of 0.01–0.03 ohm-cm and a thickness of 200–300 microns. The physical isolation charge-barrier layer 84 is a $SiO_2$ layer having a thickness of 0.4 microns. The n layer 86 has a resistivity of 1000 ohm-cm and a thickness of 0.17 ohm-cm. The active region 88 has a resistivity of 25–35 ohm-cm and a thickness of 5.4 microns.

The architecture of this embodiment of the invention uses a combination of an insulator layer 84 and an electron absorption layer 86. However, the thick p+ bulk region 82 absorbed nearly all the IR photons. In order to give optimum IR response the p+ region 82 must be thinned to prevent poor image response and to provide adequate performance as an IR imaging sensor.

Since the above embodiments of the invention require only fabrication changes at the wafer level, a manufacturer of CCD sensors can use standard semiconductor processing and testing techniques. This provides low-cost IR CCDs which are radiation tolerant without requiring special design and processing techniques such as are required by radiation hardened IR CCDs.

In summary, the invention provides a wafer-scale charge isolation techniques that inhibit or reduce the flow of electrons created in the bulk regions of silicon, due to the passage of an ionizing radiation, from reaching the active charge collection volume of a pixel in a charge coupled device (CCD) operating in the infrared (IR) wavelength band. Although the techniques were demonstrated with a platinum-silicide (PtSi) IR CCD, the techniques are applicable to other charge sensitive devices such as digital logic circuits, including memories, and to imaging devices operating in the visible wavelength band. The invention makes feasible low-cost production of devices which provide low noise response to ionizing radiation environments. Charge isolation is achieved by the introduction of a charge barrier. Three types of barriers were described: an insulator, a potential barrier, and a combination of the two. A wafer type with a buried $SiO_2$ layer was used to demonstrate the insulator barrier concept. The potential barrier concept was demonstrated by varying the local concentration of majority carriers at a uniform depth below the wafer surface. Since the charge barrier is beneath the active region of the device, the manufacturer's normal semiconductor processing is applicable and added costs are minimal. The process was demonstrated by manufacturing standard IR CCDs on charge isolation wafers to create PtSi IR CCDs with reduced image noise in ionizing radiation environments.

CCDs are ideal devices for investigating and developing methods for mitigating performance degradation due to ionizing radiation or caused by ionizing radiation.

The charge isolation techniques demonstrated on p-type silicon wafers using various known dopant materials can also be applied to n-type silicon. The insulator barrier effectively blocks the passage of holes and electrons from bulk silicon to the charge sensitive area. The charge barrier is configured to enhance the electron-hole recombination. Thus by varying the type and concentration of doping, one can block the passage of either electrons or holes.

The principles of this invention are also applicable to a charge-sensitive semiconductor device, such as, for example, a digital logic circuit or a digital memory device. In a digital circuit the amount of stored charge defines a logical one or zero. As the operating voltages and circuit sizes decrease to sub micron feature size, the difference in the stored charge between a logical one or zero decreases. Thus the circuit becomes more sensitive to ionizing radiation in the nuclear and natural environments.

A charge-sensitive semiconductor device having increased radiation tolerance includes a silicon substrate formed from a silicon wafer. The silicon wafer has a bulk region, or volume, and an active circuit volume, or region. As described herein above, means are provided for isolating one portion of the wafer from another. In this case means are provided for isolating the bulk volume of the silicon wafer from the active circuit volume to prevent and inhibit charged particles created in the bulk volume due to ionizing radiation from reaching the active circuit volume. The means for isolating includes a charge barrier or a physical barrier.

TEST RESULTS

The standard device was a 256×244 element array of Schottky barrier photo diode fabricated integrally with a charge coupled device (CCD) readout. The photo diodes were created by evaporating a thin layer of platinum silicide (PtSi) on a p-type silicon substrate. The infrared photons are absorbed in the PtSi to create holes. Holes with great enough energy cross the barrier leaving behind an electron. The electrons are then transferred into the CCD channel and readout. The PtSi array is sensitive to infrared photons with wavelengths of about 1 μm to about 5 μm.

Standard processes use extrinsic p-type material as the substrate. Past history shows that devices fabricated using this architecture are very susceptible to proton-induced noise. Several architectures were designed and tested. The standard substrate is used in normal processing. In addition to the standard substrate, three additional architectures, as described in connection with FIGS. 5, 6, 7, were designed to minimize radiation-induced charge collection in the substrate.

One each of the standard, insulator barrier, and charge barrier devices were tested in a gamma ray radiation environment and in proton radiation environment. Descriptions and results of those tests are in the following sections. The combined-barrier type devices of FIG. 7 were not fully tested due to operational problems because too many optical carriers were absorbed by the substrate to make an adequate IR detector.

A standard PtSi Focal Plane Array has the following characteristics:

Unit cell size: 25 um×31.5 um.

Detector size: 19 um×15 um.

Number of columns: 256

Number of rows: 244

Integration time: 63 msec

Number of clock signals: 10

Number of active bias lines: 6

All pixels multiplexed onto one output line via vertical and horizontal CCD registers.

Temperature of operation: 77° K.

Spectral response: 1.1–5 um.

TEST CONDITIONS FOR GAMMA RADIATION

The measurement conditions used in the gamma radiation tests are summarized in Table 1. Both total dose and gamma flux tests were performed at 77° K. During testing, the device was not allowed to warm up to prevent annealing.

TABLE 1

Measurement Conditions for Standard PtSi Array Tests

| | |
|---|---|
| Test Temperature | 77° K. |
| Optical Background | $1.2 \times 10^{12}$ photons/cm$^2$/sec |
| Optical Signal | $2.4 \times 10^{15}$ photons/cm$^2$/sec |
| Cold Filter Wavelength | 3.0396–3.1453 μm @ 300K |
| Gs$^{137}$ Gamma Flux | $4 \times 10^6$, $4 \times 10^7$, $5 \times 10^8$, $5 \times 10^9$ photons/cm$^2$/sec |
| Total Dose Levels | $1 \times 10^3$–$2 \times 10^4$ rad (Si) |

PULSE HEIGHT ESTIMATE FOR GAMMA RADIATION

Two methods were used to estimate the average pulse height in three devices. The average pulse height <n>, was estimated for each device using the standard method of assuming exponentially-distributed pulse heights. The average pulse height was also estimated using an alternative method of using the average DC shift.

The pulse height <n> for the standard device of FIG. 3 was estimated using a pulse height distribution at $4 \times 10^7$ γ/cm$^2$/s. The average pulse height for the device was approximately 15 mV which was converted to 1913 e−.

The pulse height for the charge barrier device of FIG. 6 was also estimated using the measured pulse height distribution at $4 \times 10^7$ γ/cm$^2$/s. The average pulse height for the device was approximately 12 mV which was converted to 1749 e−.

The average pulse height for the insulator-barrier device of FIG. 5 is approximately 8 mV which was converted to 109 e−.

Table 2 lists the average pulse heights calculated using the exponential distribution method.

TABLE 2

Average Heights Using Exponential Distribution Method

| Device Type | Insulator Barrier | Charge Barrier | Standard Device |
|---|---|---|---|
| Average Pulse Height <n> | 109 electrons | 1749 electrons | 1913 electrons |

The DC shift for the standard device at $10^9$ γ/cm2/s was 125 mV. Converting to electrons, the total shift in electrons was calculated and the average pulse height <n> was calculated to be 1627 electrons. This compares favorably with the exponential distribution estimates.

The DC shift for the charge-barrier device at $10^9$ γ/cm2/s was 90 mV and the average pulse height <n> was calculated to be 1339 electrons.

The DC shift for the insulator-barrier device at $10^9$ γ/cm2/s was 10 mV and the average pulse height <n> was calculated to be 136 electrons.

Table 3 lists the estimated pulse height for the three devices.

TABLE 3

Average Pulse Heights using DC Shift Estimation Method.

| Device Type | Insulator Barrier | Charge Barrier | Standard Device |
|---|---|---|---|
| Average Pulse Height <n> | 136 electrons | 1339 electrons | 1627 electrons |

TOTAL DOSE RESULTS
NOISE

The noise levels for each device pre-radiation exposure was on the order of 5 to 10 mV. As the total dose on the devices is increased, the noise on the standard and insulator-barrier devices tended to increase while the noise on the charge barrier device remained constant. The noise level did not change significantly, but the signal level was extremely low by 20 k rads. Also, after the standard device was rebiased, the noise level returned to normal levels.

DYNAMIC RANGE

The definition of dynamic range used for these calculations is the absolute value of the difference between the output voltage with the light on and the output voltage with the light off divided by the noise voltage. The initial values for the dynamic range of each device varied from ten to forty. These are somewhat low, but with the noise increased by non-uniformity and the light-on value well below saturation, the dynamic ranges are well within reason. The light-on value was run well below saturation to prevent gamma hits on a bright pixel from saturating the output stage. In all cases, the dynamic range decreased with total dose. After rebiasing and annealing, all devices showed near pre-rad dynamic range. This means that periodic annealing would allow survival to higher dose levels and thereby extend on-orbit lifetimes. In addition, self annealing will maintain performance in the low dose rate environment typical of a natural space environment.

SUMMARY REGARDING GAMMA RADIATION TESTS

Three PtSi CCD focal plane arrays were tested. One was a standard device, the other two were devices fabricated on substrates to minimize electrical noise due to ionizing radiation. The unhardened standard FPA, as expected, was very sensitive to gamma radiation. An unexpected result was that the pulses generated in the device were bipolar.

The two devices designed to reduce impulsive noise levels both worked to reduce gamma sensitivity. The charge isolation architecture in the charge barrier worked well at attenuating pulses of one polarity but not the other. The charge isolation architecture in the insulator barrier device worked to attenuate pulses of both polarities. The total dose hardness of the three devices were approximately the same. The output stage of all devices was of an unhardened design. The output stage could easily be hardened to higher total dose levels using well known hardening techniques or annealing could be periodically used to rejuvenate the device.

TEST CONDITIONS FOR PROTON RADIATION

The measurement conditions used in the proton radiation tests are summarized in Table 4. The proton tests were performed at a temperature of 77K. During testing, the device temperature was held constant in order to prevent annealing. The temperature was varied to determine if the proton-induced response was effected by temperature. The optical background for these tests was $1.2 \times 10^{12}$ photons/cm²/second. The background was achieved by illuminating a ¾" aperture and a 3.0396 μm to 3.1453 μm filter with a 300K backbody. Both filter and aperture were at =77K. The optical signal flux was set at $=2.4 \times 10^{15}$ photons/cm²/second. This was obtained using appropriate apertures and a 300° C. blackbody shining through the cooled bandpass filter which transmitted between 3.0396 μm and 3.1453 μm. The signal level was set to achieve an adequate signal-to-noise ratio, while maintaining as small a signal level as possible.

In order to more accurately characterize the implications of proton-induced noise on signal processing algorithms, a test pattern was imaged on the focal plane array. A standard "Air Force" target described in Military Standard 150-A paragraph 5.1.1.7 was imaged on the FPA. A target element consists of two patterns at right angles to each other. Each pattern consists of three lines and two spaces of equal width and length five times the width. The change in pattern size progresses geometrically as the sixth root of two or conversely the lines per millimeter count doubles with every sixth element, and these groups of six elements are referred to as a group and assigned a group number which tells the power of 2 to which the first element in the group was raised to determine the number of lines per millimeter in that element. The zero group then has one cycle per millimeter. The test reticle is made of quartz and is transmissive to wavelengths of up to four (4) μm. The opaque image is placed on the quartz substrate using a photolithographic process. The reticle was illuminated with a 300° C. (573K) blackbody source and a concentrating lens. The reticle was imaged on the FPA using a combination of CaF₂ and ZnSe lenses.

TABLE 4

| Measurement Conditions for Standard PtSi Array Tests | |
|---|---|
| Test Temperature | 77K |
| Optical Background | $1.2 \times 10^{12}$ photons/cm²/s |
| Optical Signal | $2.4 \times 10^{15}$ photons/cm²/s |
| Cold Filter Bandpass | 3.0396–3.1453 μm @ 300K |
| Integration Time | 63 msec |
| Proton Levels | Clear, $10^5$, $10^6$, $10^7$, $10^8$ protons/cm²/sec |

PULSE HEIGHT ANALYSIS FOR PROTON RADIATION

Two methods are available for estimating the proton pulse heights. These are the exponential distribution method and the DC shift method. The exponential distribution method requires the analyst to separate the exponentially distributed proton-induced samples from the normally distributed samples with only classically generated noise (i.e., photon noise, cable noise, etc.) The method is most often used to estimate height distributions.

PULSE HEIGHT ESTIMATES FOR PROTON RADIATION

The pulse heights were estimated using only the 63 MeV proton data.

The pulse height for the standard device with a proton flux at 63 MeV is estimated using the distribution at $1.04 \times 10^7$ protons/cm²/s. Using a measured distribution, the average pulse height for the standard device is approximately 0.16 V. The average pulse height for the standard device is 20,408 e–.

The pulse height for the charge-barrier device with a proton flux level at 63 MeV was estimated using a measured distribution at $8.41 \times 10^6$ protons/cm²/s. The average pulse height for the charge-barrier device is approximately 60 mV which was converted to 8021 e–.

The pulse height for the insulator-barrier device with a proton flux level at 63 MeV was estimated using the distribution of $9.72 \times 10^7$ protons/cm²s. The average pulse height for the insulator-barrier device is approximately 50 mV which was converted to 8681 e–.

Table 5 summarizes the average pulse heights calculated using the exponential distribution method.

TABLE 5

| Average Pulse Heights Using Exponential Distribution Method | | | |
|---|---|---|---|
| Device Type | Insulator Barrier | Charge Barrier | Standard Device |
| Average Pulse Height <n> | 8681 electrons | 8021 electrons | 20408 electrons |

SUMMARY REGARDING PROTON RADIATION PERFORMANCE

Three PtSi CCD focal plane arrays were tested. One was a standard device, the other two devices were fabricated on substrates designed to minimize noise due to ionizing radiation. The performance of the unhardened standard part was not as good as either of the other two hardened parts in terms of average pulse height. In a similar manner to the parts tested for gamma-flux and total-dose response, both the insulator-barrier and charge-barrier hardening concepts were effective in mitigating the proton-induced events.

APPLICATIONS

Applications of the invention are in radiation environments which render current imaging CCD focal planes, operating in the infrared (IR) and visible wavelength bands, useless due to image noise produced by ionizing radiation. Charge-isolation CCDs according to the invention are useful in low cost IR and visible camera systems for spacecraft which need to operate in an inter-planetary space environment or in the radiation belts of Earth. The invention is also useful for space-based application which must be able to track dim targets in a debris gamma environment. Additional applications are in radiation environments ranging from nuclear battlefields to reactors and radioactive storage sites.

Commercial applications include imaging in high radiation areas of nuclear reactors and low-level radioactive waste sites for potential users such as power companies with nuclear power plants. Normal CCD cameras are unacceptable and radiation-hardened cameras are too expensive. Civilian space programs can utilize image sensors fabricated with these wafer-scale techniques for surveying planetary surfaces while orbiting within the Planet's radiation belts. Also, future imaging telescopes in low-Earth orbits can be made less susceptible to the passage of satellites carrying radioactive thermal generators (RTGs) and small nuclear reactors.

A manufacturer can produce a radiation-tolerant version of a standard CCD product by merely switching from a standard wafer as the input to the process stream to one with a "barrier", as described herein above. No other changes in the production process are required. Six inch wafers with a $SiO_2$ layer (i.e., SIMOX wafers) buried several microns beneath their surface are available from US and Japanese producers. A six inch wafer has approximately 160 cm² and can yield over 100 CCDs per wafer. Adding a $SiO_2$ layer would cost less than one dollar per wafer. Since a fully-tested CCD costs over 100 dollars per device, the wafer cost increment is very small. $SiO_2$-wafers are now standard for a number of high density devices in Japan.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A CCD imaging device, comprising:
   a silicon wafer having a bulk volume and a collection volume;
   means for preventing charge created in the bulk volume of the silicon wafer from entering the collection volume of each pixel in the imaging device; a metal-containing layer formed on the collection volume for generating charges from photons; and
   a CCD readout layer formed on the metal-containing layer for detecting the charges in the metal-containing layer.

2. The CCD imaging device of claim 1 wherein the means for preventing charge created in the bulk volume of the silicon wafer from entering the collection volume of each pixel in the imaging device includes a barrier layer formed in the silicon wafer.

3. The CCD imaging device of claim 2 wherein the barrier layer formed in the silicon wafer includes a physical barrier.

4. The CCD imaging device of claim 3 wherein the physical barrier includes an insulating layer.

5. The CCD imaging device of claim 4 wherein the insulating layer includes $SiO_2$.

6. The CCD imaging device of claim 2 wherein the barrier layer formed in the silicon wafer includes a charge barrier.

7. The CCD imaging device of claim 6 wherein the charge barrier includes a doped layer.

8. The CCD imaging device of claim 7 wherein the doped layer includes boron.

9. The CCD imaging device of claim 2 wherein the barrier layer formed in the silicon wafer includes a physical barrier and a charge barrier.

10. The CCD imaging device of claim 9 wherein the physical barrier includes an insulating layer.

11. The CCD imaging device of claim 10 wherein the insulating layer includes $SiO_2$.

12. The CCD imaging device of claim 9 wherein the charge barrier includes a doped layer.

13. The CCD imaging device of claim 12 wherein the doped layer include boron.

14. The CCD imaging device of claim 1, wherein said device operates in one of infrared wavelength band and visible wavelength band.

* * * * *